(12) United States Patent
Mori et al.

(10) Patent No.: US 7,813,135 B2
(45) Date of Patent: Oct. 12, 2010

(54) SEMICONDUCTOR DEVICE

(75) Inventors: Shogo Mori, Kariya (JP); Akiko Kumano, Kariya (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 0 days.

(21) Appl. No.: 12/154,592

(22) Filed: May 23, 2008

(65) Prior Publication Data

US 2008/0291636 A1    Nov. 27, 2008

(30) Foreign Application Priority Data

May 25, 2007  (JP)  ............................ 2007-139032

(51) Int. Cl.
    *H05K 7/20* (2006.01)
    *H01L 23/34* (2006.01)
(52) U.S. Cl. .................. 361/719; 361/704; 361/707; 361/709; 257/706; 257/712; 438/122
(58) Field of Classification Search .............. 361/688, 361/704, 707, 709, 718, 719; 165/185; 174/252; 257/706, 712, E23.101; 438/122
    See application file for complete search history.

(56) References Cited

U.S. PATENT DOCUMENTS

| | | | |
|---|---|---|---|
| 4,723,891 A | | 2/1988 | Takenaka et al. |
| 5,119,171 A | * | 6/1992 | Lesk et al. .................. 257/623 |
| 5,610,440 A | * | 3/1997 | Isozaki ....................... 257/713 |
| 5,923,084 A | * | 7/1999 | Inoue et al. .................. 257/712 |
| 6,816,377 B2 | * | 11/2004 | Itabashi et al. ............... 361/704 |
| 7,031,165 B2 | * | 4/2006 | Itabashi et al. ............... 361/719 |
| 7,195,145 B2 | * | 3/2007 | Waldvogel et al. ........... 228/256 |
| 7,232,315 B2 | | 6/2007 | Uchida et al. |
| 7,569,929 B2 | * | 8/2009 | Mori et al. ................... 257/706 |
| 2003/0154731 A1 | | 8/2003 | Imai et al. |
| 2004/0258536 A1 | | 12/2004 | Ota et al. |
| 2008/0290498 A1 | * | 11/2008 | Mori et al. .................. 257/712 |
| 2008/0290499 A1 | * | 11/2008 | Nishi et al. .................. 257/712 |
| 2008/0290500 A1 | * | 11/2008 | Iwata et al. .................. 257/712 |
| 2009/0139704 A1 | * | 6/2009 | Otoshi et al. ................ 165/185 |

(Continued)

FOREIGN PATENT DOCUMENTS

CN    1781347 A    5/2006

(Continued)

OTHER PUBLICATIONS

European Search Report for application No. 09158796.4 -2315 dated Aug. 27, 2009.

(Continued)

*Primary Examiner*—Jayprakash N Gandhi
*Assistant Examiner*—Robert J Hoffberg
(74) *Attorney, Agent, or Firm*—Locke Lord Bissell & Liddell LLP

(57) ABSTRACT

The semiconductor device includes a circuit board. The circuit board has an insulating substrate, a metal circuit fixed on a first side of the insulating substrate, and a metal plate fixed on a second side of the insulating substrate. The semiconductor device further has a semiconductor element mounted on the metal circuit, a stress reducing member fixed on the metal plate, and a heat sink fixed on the stress reducing member. The stress reducing member is plate-shaped and has round-shaped corners.

8 Claims, 6 Drawing Sheets

U.S. PATENT DOCUMENTS

| | | | |
|---|---|---|---|
| 2009/0141451 A1* | 6/2009 | Mori et al. | 361/699 |
| 2009/0147479 A1* | 6/2009 | Mori et al. | 361/699 |
| 2009/0200065 A1* | 8/2009 | Otoshi et al. | 174/252 |

FOREIGN PATENT DOCUMENTS

| | | | |
|---|---|---|---|
| DE | 40 04 844 C1 | | 3/1991 |
| DE | 42 34 506 A1 | | 4/1993 |
| EP | 0 789 397 A2 | | 8/1997 |
| EP | 1 336 757 A2 | | 8/2003 |
| EP | 1 489 304 A1 | | 12/2004 |
| EP | 1 873 827 A1 | | 1/2008 |
| EP | 1970955 A1 | * | 9/2008 |
| JP | 05029509 A | * | 2/1993 |
| JP | 11-017081 A | | 1/1999 |
| JP | 2002-176127 | | 6/2002 |
| JP | 2002-198468 A | | 7/2002 |
| JP | 2003-017627 | | 1/2003 |
| JP | 2003017627 A | * | 1/2003 |
| JP | 2004-153075 | | 5/2004 |
| JP | 2004-327648 A | | 11/2004 |
| JP | 2006-240955 A | | 9/2006 |
| JP | 2007173405 A | * | 7/2007 |
| WO | WO 2006109660 A1 | * | 10/2006 |
| WO | WO 2007007602 A1 | * | 1/2007 |

OTHER PUBLICATIONS

English translation of a first office action for corresponding Chinese application No. 2008-10127716.2, issued on Jun. 19, 2009.

European Search Report for application No. 08156826.3-1235 dated Dec. 14, 2009.

* cited by examiner

SEMICONDUCTOR DEVICE

BACKGROUND OF THE INVENTION

The present invention relates to a semiconductor device, such as a power module. More specifically, the invention relates to a semiconductor device which includes a circuit board having an insulating substrate, a first metal plate fixed on a first side of the insulating substrate, and a second metal plate fixed on a second side of the insulating substrate. The semiconductor device further includes a semiconductor element mounted on the first metal plate, and a heat cooling element fixed on the second metal plate.

In a conventional semiconductor device, thermal stress arises at a bond surface between the semiconductor element and the insulating substrate, due to a difference in the linear expansion coefficients of the semiconductor element and the insulating substrate. This thermal stress increases in proportion to the distance from the center of the bond surface. This thermal stress is likely to cause cracking at the bond surface, and warpage of the insulating substrate and the heat radiator. Such cracking or warpage impairs heat transfer performance.

Japanese Unexamined Patent Publication No. 2004-153075 discloses a power module embodying a proposed solution to the above problem. As shown in FIG. 5A, the power module includes an insulating substrate 101, a heat-generating-element 102 fixed on a first side of the insulating substrate 101, a heat radiator 103 soldered to a second side of the insulating substrate 101, and a heat sink 104 fixed to the heat radiator 103 by screws. The heat radiator 103 has a pair of plate-shaped heat radiator bodies 103a formed of a material having a high thermal conductivity, such as a copper. The heat radiator 103 further has a low-thermal-expansion material 105, such as an Invar alloy, intervening between the heat radiator bodies 103a.

In Japanese Unexamined Patent Publication No. 2006-294699, a heat radiator 120 is proposed. As shown in FIG. 5B, the heat radiator 120 includes an insulating substrate 121 having a first side on which is placed a heat-generating-element 122, a heat sink 123 fixed to a second side of the insulating substrate 121 through a metal plate 124. A stress relaxation member 125, having a stress-absorbing space, is intervened between the insulating substrate 121 and the heat sink 123. The stress relaxation member 125 is formed of a material having a high thermal conductivity, and is metal-bonded to both the insulating substrate 121 and the heat sink 123. The stress relaxation member 125 has stress relaxation holes 126.

Japanese Unexamined Patent Publication No. 2002-176127 discloses another cooling structure for an electronic component 130, and an electric circuit device. As shown in FIG. 5C, in addition to an electric connection part 131 between the electric component 130 and a board 132, the electric circuit device has a thermally-conductive metal layer 133 between the electric component 130 and the board 132. The metal layer 133 is separated into three or more sections with respect to the center of the metal layer 133. One or more side lines of each separated part are slightly rounded by chemical processing (plate processing). In this case, the use of chemical processing significantly increases the time for manufacturing the electric circuit device.

Presently, there is a need for a semiconductor device which has improved cooling performance, in other words, better thermal conductivity from a semiconductor element to a heat radiator, while minimizing the thermal stress.

SUMMARY OF THE INVENTION

The present invention is directed to a semiconductor device. In accordance with one embodiment of the present invention, the semiconductor device includes a circuit board. The circuit board has an insulating substrate, a first metal plate fixed on a first side of the insulating substrate, and a second metal plate fixed on a second side of the insulating substrate. The semiconductor device further has a semiconductor element mounted on the first metal plate, a stress reducing member fixed on the second metal plate, and a heat cooling element fixed on the stress reducing member. The stress reducing member is plate-shaped and has at least one round-shaped corner.

It is not intended that the invention be summarized here in its entirety. Rather, other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the embodiments together with the accompanying drawings in which:

DETAILED DESCRIPTION OF THE EMBODIMENTS

A semiconductor device according to an embodiment of the present invention will now be described with reference to FIGS. 1 through 3.

Figure 2:
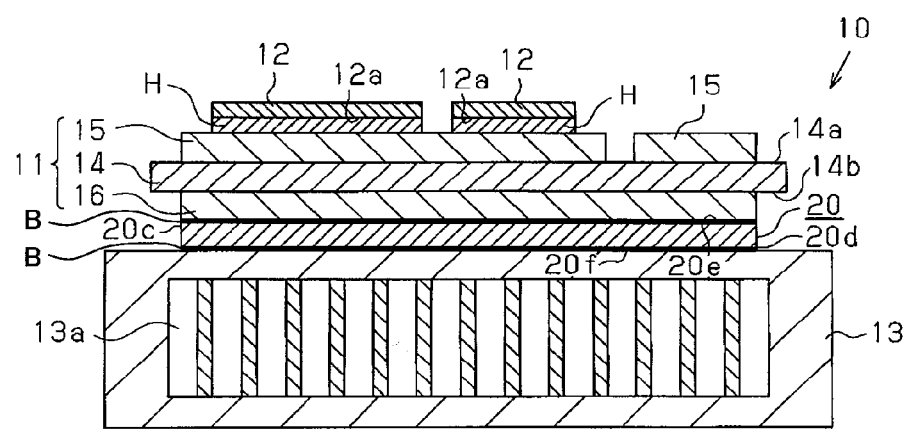
FIG. 2 is a cross-sectional view illustrating the semiconductor device that is taken along the line 2-2 in FIG. 1.

As shown in FIG. 2, a semiconductor device 10 has a circuit board 11, semiconductor elements 12 mounted on the circuit board 11, and a heat sink 13 (i.e., a heat cooling element). The circuit board 11 has a plate-shaped ceramic substrate 14 (i.e., an insulating substrate), two metal circuits 15 (i.e., a first metal plate) fixed on the first side 14a of the ceramic substrate 14, and a metal plate 16 (i.e., a second metal plate) fixed on the second side 14b of the ceramic substrate 14.

The heat sink 13 is fixed to the ceramic substrate 14 through the metal plate 16 and a stress reducing member 20. The ceramic substrate 14 is formed of a electrically insulating material, such as aluminum nitride, aluminium oxide or silicon nitride. The metal circuits 15, the metal plate 16 and the heat sink 13 are formed of a good thermal conductor, such as aluminum, aluminum alloys or copper.

Figure 1:
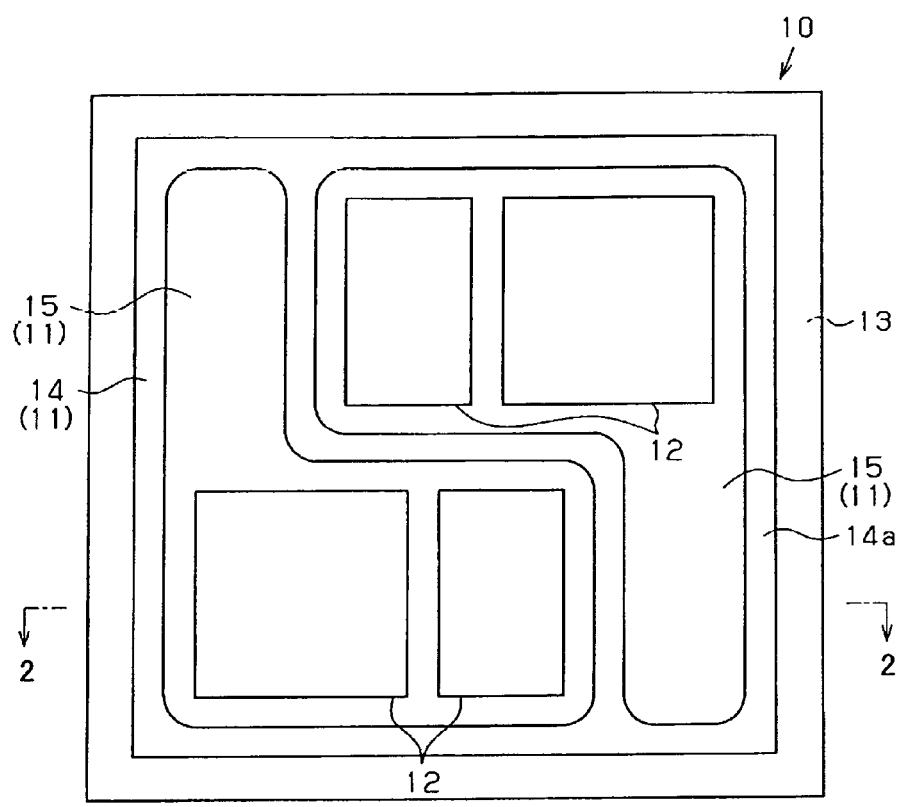
FIG. 1 is a plan view illustrating a semiconductor device according to an embodiment of the present invention.

As shown in FIGS. 1 and 2, the semiconductor elements 12 are mounted on the metal circuits 15 through solder layer H. Two semiconductor elements 12 are mounted on each metal circuit 15. The semiconductor elements 12 are electronic components, such as an IGBT (Insulated Gate Bipolar Transistor), MOSFET or diode.

As shown in FIG. 2, in order to guide the flow of a fluid such as a coolant, passages 13a are formed inside of the heat sink 13.

The stress reducing member 20 is intervened between the heat sink 13 and the metal plate 16. The plate-shaped stress reducing member 20 is formed of a material having a high thermal conductivity, such as aluminum. A first side 20e of the stress reducing member 20 faces bond surfaces 12a of the semiconductor elements 12 to the metal circuits 15. The entirety of the first side 20e is brazed to the metal plate 16, and the entirety of the second side 20f of the stress reducing member 20 is brazed to the heat sink 13. The circuit board 11 and the heat sink 13 are connected through the stress reducing member 20, so that heat generated by the semiconductor elements 12 is conducted to the heat sink 13 through the circuit board 11 and the stress reducing member 20.

Figure 3A:
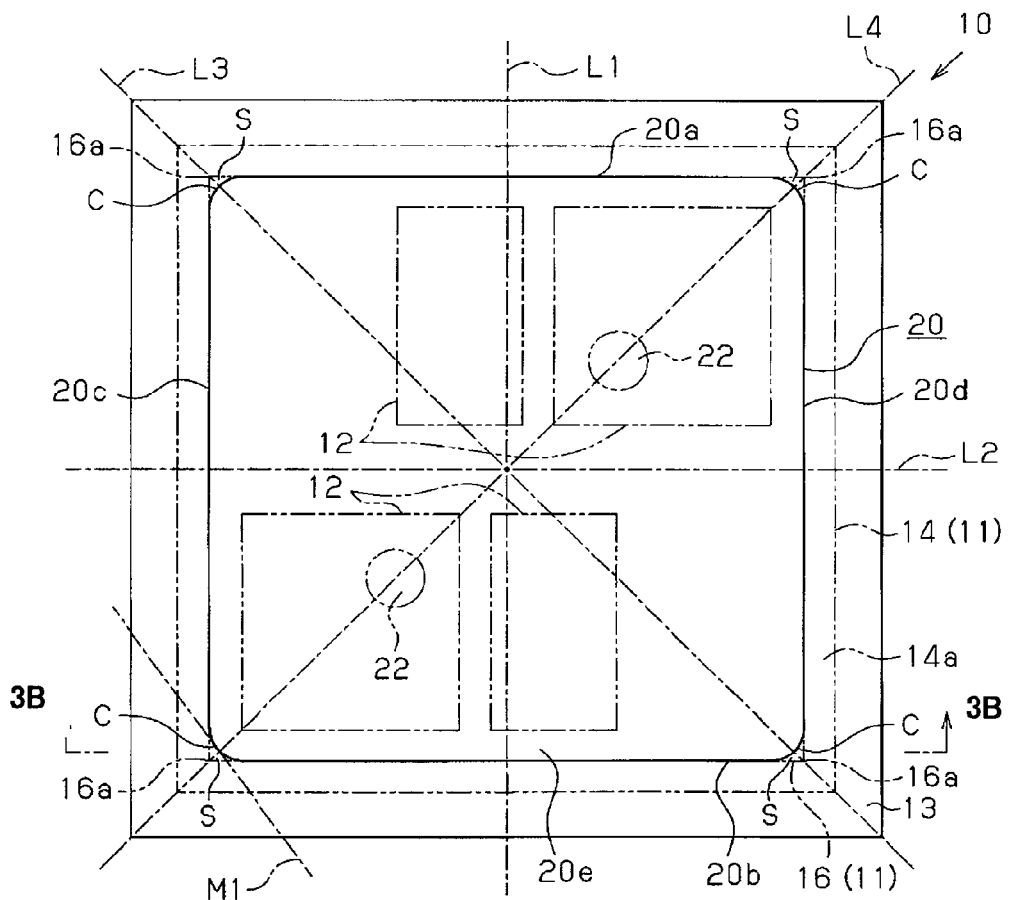
FIG. 3A is a plan view illustrating a stress reducing member of a semiconductor device according to an embodiment of the present invention.

The stress reducing member 20 will now be specifically described. In FIG. 3A, the semiconductor elements 12, the ceramic substrate 14 and the metal plate 16 are drawn by two-dot chain line. A first side line 20a and a second side line 20b of the stress reducing member 20 face each other in a top-and-bottom direction, and a third side line 20c and a fourth side line 20d of the stress reducing member 20 face each other in a left-and-right direction. A surrounding edge-portion of the stress reducing member 20 is formed by the side lines 20a, 20b, 20c and 20d, and four corners C. The corners C are rounded by way of press working. Two side lines (either, the first side line 20a and the fourth side line 20d, the second side line 20b and the fourth side line 20d, the second side line 20b and the third side line 20c, or the first side line 20a and the third side line 20c) forming each corner C are connected together by an arc.

In this embodiment, the stress reducing member 20 is in the shape of a square 30 mm on a side line. The stress reducing member 20 has the substantially same plan shape and size as the metal plate 16. The corners C are rounded in the shape of an arc, preferably, 3.5 mm to 10 mm (more preferably 3.5 mm to 5 mm) in diameter. Thermal stress tends to accumulate at a corner. Therefore, if the diameter is less than 3.5 mm, it is insufficient to reduce thermal stress. On the other hand, if the diameter is more than 10 mm, each bond surface of the stress reducing member 20 to the metal plate 16 and the heat sink 13 decreases, such that it is insufficient to conduct the heat generated by the semiconductor elements 12 from the metal plate 16 to the heat sink 13. Note that, if tangential line M1 is drawn on any point of the line forming the corners C, tangential line M1 does not pass through the stress reducing member 20 (refer to FIG. 3A).

Referring to FIGS. 2 and 3A, the stress reducing member 20 is brazed to the metal plate 16 and the heat sink metal by a brazing filler metal B. The brazing filler metal B is in the shape of a sheet which has the same flat shape as the stress reducing member 20. In other words, the corners of the brazing filler metal B are rounded.

Figure 3B:
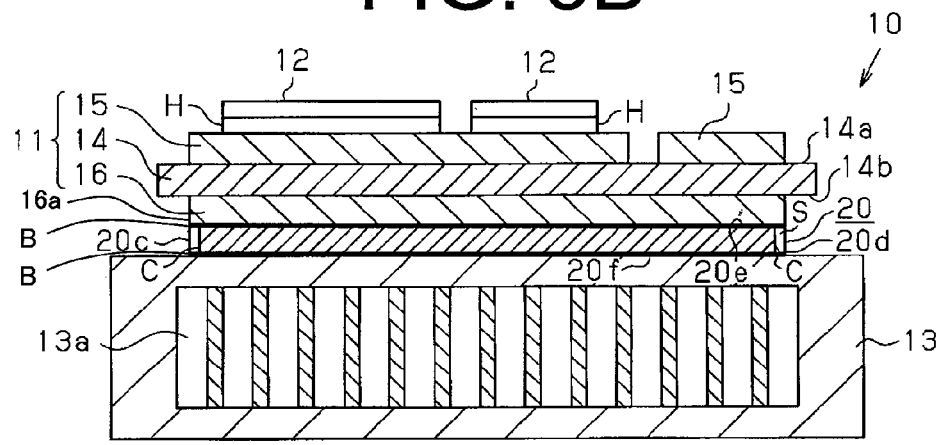
FIG. 3B is a cross-sectional view of the stress reducing member of the semiconductor device that is taken along the line 3B-3B in FIG. 3A.

The surrounding edge-portion, other than the corners C, of the stress reducing member 20 is co-extensive with a surrounding edge-portion of the metal plate 16. As shown in FIG. 3B, in the horizontal direction, the corners C are placed more inward than corners 16a of the metal plate 16. Each corner C and corresponding corner 16a form a step-structure together in the direction of the thickness of the circuit board 11. Each corner C is directly under the metal plate 16 and directly above the heat sink 13. Thus, a stress reducing space S is formed by the metal plate 16, the heat sink 13 and the corners C.

As shown in FIG. 3A, line L1 passes through each midpoint of the first side line 20a and the second side line 20b. Line L2 passes through each midpoint of the third side line 20c and the fourth side line 20d. The corner C formed between the first side line 20a and the third side line 20c, is symmetrical about line L2 with the corner C formed between the second side line 20b and the third side line 20c. The corner C formed between the first side line 20a and the fourth side line 20d, is symmetrical about line L2 with the corner C formed between the second side line 20b and the fourth side line 20d. The corner C formed between the first side line 20a and the third side line 20c, is symmetrical about line L1 with the corner C formed between the first side line 20a and the fourth side line 20d. The corner C formed between the second side line 20b and the third side line 20c, is symmetrical about line L1 with the corner C formed between the second side line 20b and the fourth side line 20d.

Lines L3 and L4 each represent a diagonal line, which passes through two corners C, of the stress reducing member 20. The corner C formed between the first side line 20a and the fourth side line 20d, is symmetrical about line L3 with the corner C formed between the second side line 20b and the third side line 20c. The corner C formed between the first side line 20a and the third side line 20c, is symmetrical about line L4 with the corner C formed between the second side line 20b and the fourth side line 20d.

When the above-mentioned semiconductor device 10 is applied to, for example, a control circuit for controlling power provided to a car motor, the semiconductor device 10 controls power according to car driving conditions. In this case, heat generated by the semiconductor elements 12 is conducted to the heat sink 13 through the metal circuit 15, the ceramic substrate 14, the metal plate 16 and the stress reducing member 20. The heat, which has been conducted to the heat sink 13, is removed by the fluid flowing through the passages 13a in the heat sink 13. In other words, the heat sink 13 is cooled by the fluid. Thus, the heat is efficiently removed, and the semiconductor elements 12 are cooled.

As heat is conducted to the heat sink 13, the temperatures of the ceramic substrate 14 and the heat sink 13 become elevated, resulting in the thermal expansion of both the ceramic substrate 14 and the heat sink 13. On the other hand, when the semiconductor elements 12 cease generating heat, the temperatures of the ceramic substrate 14 and the heat sink 13 sink decrease, resulting in the thermal contraction of both the ceramic substrate 14 and the heat sink 13. In expanding and contracting with heat, thermal stress arises from a difference in the linear expansion coefficients of the ceramic substrate 14 and the heat sink 13. However, all corners C of the stress reducing member 20 are rounded, so that thermal stress affecting the corners C is reduced. Furthermore, when thermal stress arises, the stress reducing member 20 may be deformed in the stress reducing space S formed between the corners 16a and the heat sink 13, thereby reducing the thermal stress. Therefore, cracking is prevented from arising between the stress reducing member 20 and the metal plate 16, as well as between the stress reducing member 20 and the heat sink 13. Warpage of the bond surface of the heat sink 13 to the circuit board 11 is also prevented.

According to the embodiment of the invention, it is possible to bring about the following effects.

Even if thermal stress arises from a difference in the linear expansion coefficients of the ceramic substrate 14 and the heat sink 13, the stress reducing member 20 may be deformed in the stress reducing space S, so that thermal stress is reduced. Furthermore, the corners C are rounded, so that thermal stress on the corners C is more reduced compared to that on a sharp corner as shown in Japanese Unexamined Patent Publication No. 2006-294699. Therefore, cracking is prevented from arising between the stress reducing member 20 and the metal plate 16, as well as between the stress reducing member 20 and the heat sink 13. Warpage is also prevented from arising on the heat sink 13.

The corners C are rounded by pressing the material having the high thermal conductivity. Thus, the stress reducing member 20 can be easily produced in a short time. Therefore, the semiconductor device 10 can be produced in a short time. Where the corners are rounded by way of chemical processing (see, for example, Japanese Unexamined Patent Publication No. 2002-176127), that benefit is not achieved.

Figure 5A:
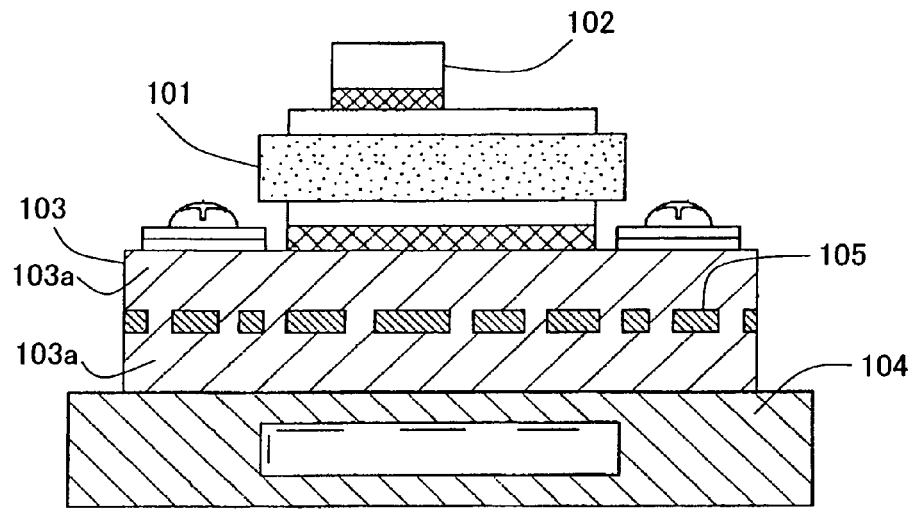
FIG. 5A is a cross-sectional view illustrating a background art.
Figure 5B:
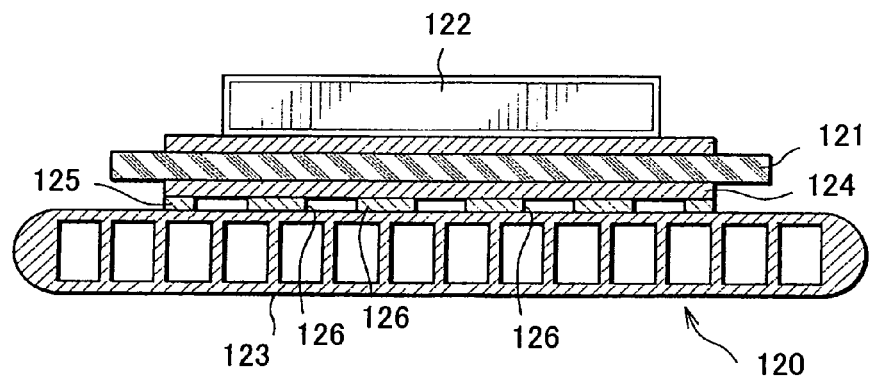
FIG. 5B is a cross-sectional view illustrating another background art.
Figure 5C:
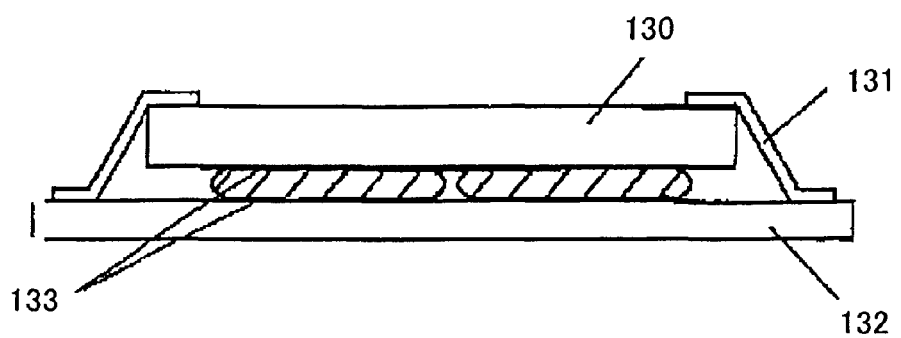
FIG. 5C is a cross-sectional view illustrating further other background art.

The entirety of the first side of the stress reducing member 20 is fixed on the metal plate 16, which resulting in improved conduction of heat from the stress reducing member 20 to the heat sink 13. Where the stress reducing member 20 is not wholly fixed on the metal plate 16 (see, for example, FIG. 5B in which stress relaxation member 125 has stress relaxation holes 126 thereon), that benefit is not achieved.

When thermal stress is added to the stress reducing member 20, the stress reducing member 20 may be deformed in the stress reducing space S, so that thermal stress can be reduced.

The surrounding edge-portion, other than the corners C, of the stress reducing member 20 is co-extensive with the surrounding edge-portion of the metal plate 16. Thus, thermal conductivity from the metal plate 16 to the stress reducing member 20 is prevented from decreasing, even though the corners C are rounded, resulting in a decreased area for conducting the heat from the metal plate 16 to the stress reducing member 20.

Each corner C is symmetrical about either the line L1, L2, L3 or L4. Therefore, thermal stress is distributed equally to the surrounding edge-portion of the stress reducing member 20. In other words, thermal stress is prevented from being concentrated to any portion of the stress reducing member 20.

In the present invention, the following alternative implementations are also encompassed.

In an alternative embodiment to the preferred embodiment, as shown in FIG. 3A, recesses or through holes 22 are formed on the first side of the stress reducing member 20.

In an alternative embodiment to the preferred embodiment, the stress reducing member 20 has a flat shape smaller than that of the metal plate 16. In other words, the stress reducing member 20 is placed inside the surrounding edge-portion of the metal plate 16.

Figure 4:
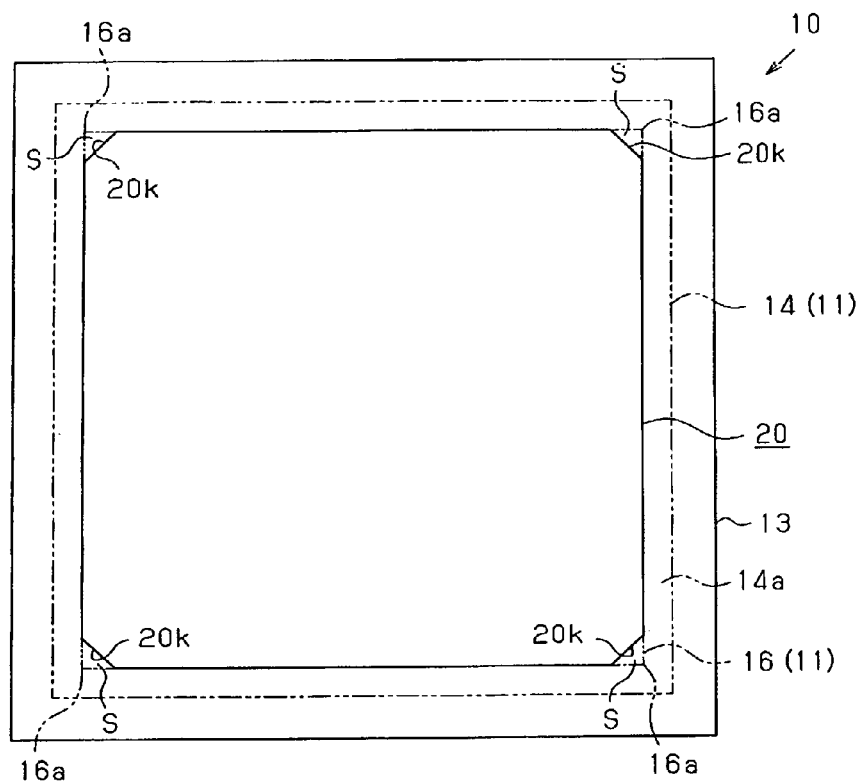
FIG. 4 is a plan view illustrating an alternative implementation of the present invention.

In another alternative embodiment to the preferred embodiment, the shape of corner C is not limited to the arc mentioned above. As shown in FIG. 4, the stress reducing member 20 has corners 20k which are made clipped by straightly planning them off. Also, it is not necessary that the corner C is symmetric with corresponding other corner C with respect to either line L1, L2, L3 or L4. In brief, any corner C is adopted as the round-shaped corner, as long as the corner C is of more obtuse than the corners 16a of the metal plate 16.

In a further alternative embodiment to the preferred embodiment, only one, two or three of the corners C are rounded.

In the above-described preferred embodiment, water is adopted as a fluid flowing through the heat sink 13. In an alternative embodiment to the preferred embodiment, however, another liquid or air is adopted.

In an alternative embodiment to the preferred embodiment, a boiling-cooled-type heat sink is adopted as the heat radiator.

In another alternative embodiment to the preferred embodiment, one, or more than two metal circuits 15 are placed on the circuit board 11. Also, one, or more than two semiconductor elements 12 are placed on the circuit board 11.

In a further alternative embodiment to the preferred embodiment, the semiconductor device 10 can be applied to other than the control circuit on the car.

Therefore, the present examples and embodiments are to be considered as illustrative and not restrictive and the invention is not to be limited to the details given herein but may be modified within the scope of the appended claims.

This application claims a foreign priority benefit based on Japanese Patent Application No. 2007-139032, filed on May 25, 2007, which is hereby incorporated by reference herein in its entirety as if fully set forth herein.

What is claimed is:

1. A semiconductor device, comprising:
   a circuit board including an insulating substrate, a first metal plate fixed on a first side of the insulating substrate, and a second metal plate fixed on a second side of the insulating substrate;
   a semiconductor element mounted on the first metal plate;
   a stress reducing member brazed to the second metal plate by a first brazing filler metal, the stress reducing member being plate-shaped and having a plurality of round-shaped corners in planar view, wherein the stress reducing member has a substantially same plan shape and size as the second metal plate; and
   a heat cooling element brazed to the stress reducing member by a second brazing filler metal,
   wherein each of the round-shaped corners of the stress reducing member and each corresponding corner of the second metal plate and the heat cooling element form a step-structure together in the direction of the thickness of the circuit board, respectively with the result that a stress reducing space is formed by the second metal plate, the heat cooling element and the round-shaped corner.

2. The semiconductor device of claim 1, wherein the stress reducing member is formed of a material having a thermal conductivity.

3. The semiconductor device of claim 1, wherein a first side of the stress reducing member faces a bond surface of the semiconductor element to the first metal plate, and the entirety of the first side of the stress reducing member is fixed on the second metal plate.

4. The semiconductor device of claim 1, wherein a surrounding edge-portion, other than the corner, of the stress reducing member is co-extensive with a surrounding edge-portion of the second metal plate.

5. The semiconductor device of claim 1, wherein a first side of the stress reducing member faces a bond surface of the semiconductor element to the first metal plate, and a recess is formed on the first side of the stress reducing member.

6. The semiconductor device of claim 1, wherein the stress reducing member is in the shape of a square having a first side line, a second side line, a third side line and a fourth line that define a periphery of the square shape, and a standard line passes through each midpoint of the first side line and the opposite facing second side line, and a first round-shaped corner formed between the first side line and the third side line is symmetrical about the standard line with a second round-shaped corner formed between the first side line and the fourth side line.

7. The semiconductor device of claim 1, wherein the stress reducing member is in the shape of a square having a first side line, a second side line, a third side line and a fourth side line that define a periphery of the square shape, the second side line is opposite the first side line, and a first round-shaped corner formed between the first side line and the adjoining fourth side line is symmetrical with a second round-shaped corner formed between the second side line and the third side line, about a diagonal line connecting a third round-shaped corner formed between the first side line and the third line and a fourth round-shaped corner formed between the second side line and the fourth side line.

8. A method for manufacturing a semiconductor device, comprising the steps of:

rounding a plurality of corners of a stress reducing member in planar view into round-shaped corners by press working;

fixing a first metal plate on a first side of an insulating substrate;

forming a second metal plate so that the second metal plate has a substantially same plan shape and size as the stress reducing member;

fixing the second metal plate on a second side of the insulating substrate;

mounting a semiconductor element on the first metal plate;

fixing the stress reducing member on the second metal plate by brazing; and fixing a heat cooling element on the stress reducing member by brazing, so that each of the round-shaped corners of the stress reducing member and each corresponding corner of the second metal plate and the heat cooling element form a step-structure together in the direction of the thickness of the circuit board, respectively with the result that a stress reducing space is formed by the second metal plate, the heat cooling element and the round-shaped corner, wherein the stress reducing member is plate-shaped, and is formed of a material having a thermal conductivity.

* * * * *